US008191018B1

(12) United States Patent
Molesa et al.

(10) Patent No.: US 8,191,018 B1
(45) Date of Patent: May 29, 2012

(54) METHODS AND SOFTWARE FOR PRINTING MATERIALS ONTO A SUBSTRATE

(75) Inventors: Steven Molesa, Sunnyvale, CA (US);
Erik Scher, San Francisco, CA (US);
Patrick Smith, San Jose, CA (US);
Michael Kocsis, San Francisco, CA (US)

(73) Assignee: Kovio, Inc., San Jose, CA (US)

(*) Notice: Subject to any disclaimer, the term of this patent is extended or adjusted under 35 U.S.C. 154(b) by 315 days.

(21) Appl. No.: 12/175,423

(22) Filed: Jul. 17, 2008

Related U.S. Application Data

(60) Provisional application No. 60/950,319, filed on Jul. 17, 2007.

(51) Int. Cl.
*G06F 17/50* (2006.01)
*G06F 19/00* (2011.01)
*G06K 9/00* (2006.01)

(52) U.S. Cl. ........... 716/55; 716/52; 716/53; 716/54; 700/98; 700/120; 700/121; 382/141; 382/144; 382/145; 382/154

(58) Field of Classification Search ............ 716/21, 716/5, 52, 53, 54, 55; 700/98, 120, 121; 382/141, 144, 145, 154
See application file for complete search history.

(56) References Cited

U.S. PATENT DOCUMENTS

| | | | | |
|---|---|---|---|---|
| 5,408,538 A * | 4/1995 | Kitakado et al. | ........... | 382/145 |
| 5,535,307 A * | 7/1996 | Glass | ........... | 358/1.8 |
| 6,303,253 B1 * | 10/2001 | Lu | ........... | 430/5 |
| 6,947,587 B1 * | 9/2005 | Maeda et al. | ........... | 382/149 |
| 7,003,758 B2 * | 2/2006 | Ye et al. | ........... | 716/21 |
| 7,026,082 B2 * | 4/2006 | Eurlings et al. | ........... | 430/30 |
| 7,623,220 B2 * | 11/2009 | Granik | ........... | 355/67 |
| 7,716,627 B1 * | 5/2010 | Ungar et al. | ........... | 716/19 |
| 7,856,612 B1 * | 12/2010 | Ungar et al. | ........... | 716/55 |
| 7,916,929 B2 * | 3/2011 | Maeda et al. | ........... | 382/141 |
| 7,934,172 B2 * | 4/2011 | Ivonin et al. | ........... | 716/53 |
| 2002/0031248 A1 * | 3/2002 | Maed et al. | ........... | 382/149 |
| 2005/0118515 A1 * | 6/2005 | Progler et al. | ........... | 430/5 |
| 2006/0269116 A1 * | 11/2006 | Makarovic et al. | ........... | 382/141 |
| 2007/0006113 A1 * | 1/2007 | Hu et al. | ........... | 716/19 |
| 2007/0162888 A1 * | 7/2007 | Melvin, III et al. | ........... | 716/21 |
| 2007/0209029 A1 * | 9/2007 | Ivonin et al. | ........... | 716/19 |
| 2008/0101685 A1 * | 5/2008 | Maeda et al. | ........... | 382/149 |
| 2008/0174756 A1 * | 7/2008 | Granik | ........... | 355/67 |
| 2009/0214102 A1 * | 8/2009 | Maeda et al. | ........... | 382/144 |
| 2011/0170765 A1 * | 7/2011 | Maeda et al. | ........... | 382/145 |

FOREIGN PATENT DOCUMENTS

JP 2000020569 A * 1/2000

* cited by examiner

*Primary Examiner* — Phallaka Kik
(74) *Attorney, Agent, or Firm* — The Law Offices of Andrew D. Fortney, Ph.D., P.C.; Andrew D. Fortney (57) ABSTRACT

Methods and software for correcting printable circuit layouts. The methods generally including steps of identifying shapes in an input circuit layout, applying a plurality of correction rules to the shapes, and producing an output printed circuit layout in accordance with the identified shapes and the correction rules. The input circuit layout generally comprises a bitmapped image or other description of at least one printable layer of at least one electronic component, device, or die. Embodiments of the present invention further allow for more precise control of spreading and effective coverage of features (e.g., source/drain terminal regions, gates, capacitors, diodes, interconnects, etc.) on a substrate by a printed ink composition including electronic materials.

51 Claims, 6 Drawing Sheets

METHODS AND SOFTWARE FOR PRINTING MATERIALS ONTO A SUBSTRATE

RELATED APPLICATIONS

This application claims the benefit of U.S. Provisional Patent Application No. 60/950,319, filed Jul. 17, 2007, incorporated herein by reference in its entirety.

FIELD OF THE INVENTION

Embodiments of the present invention relate to methods and software for printing electronic materials onto a substrate.

BACKGROUND

There has been a long-felt need for printable electronic components which may include semiconductors, metals, dielectrics, dopants, and/or any other material used in the fabrication of an electronic device, which may be deposited on a substrate. Compositions including such electronic material should have characteristics that allow for efficient printing applications, such as inkjet printing, gravure printing, offset lithography, screen printing, flexography, micro-spotting, pen-coating, stenciling, stamping, syringe dispensing, pump dispensing, spray-coating, slit coating, extrusion coating, meniscus coating, vapor-jet printing, etc. For example, in the area of printable dopants, a need is particularly felt for a printable dopant for forms of silicon and/or other semiconductors that are not easily or conveniently doped by ion implantation, e.g. for cost reasons or large area deposition of dopants, doped semiconductor films, etc.

Printed electronics require precise control of ink deposition volume in order to produce printed circuit features with the desired three dimensional morphological shape. Currently, most printed circuit masks are based on graphic arts printing masks. They typically use bitmapped image files (e.g., tagged image file format [TIFF], BMP, or other bitmapped image files) to describe the layout of one or more layers of a printed feature. Conventional printing devices generally produce an output pixel (e.g., an ink droplet, pattern of droplets, or other ink deposit) on the substrate for each pixel in the bitmapped image. However, printing one output pixel for each input pixel may result in an excessive volume of ink in some printed circuit applications. It would be desirable to more precisely control the volume of ink deposited onto the substrate.

Some conventional printing processes may rely on an absorbing substrate (e.g., paper or cloth) to fix a position and a size of a deposited material (e.g., an ink). Substrates typically used in manufacturing electronic devices are generally non-absorbing. The ink as printed on a non-absorbing substrate will behave as a liquid and will tend to move and/or spread until (or unless) the solvent is evaporated. Typically, the evaporation rate of the deposited ink is greatest near its edge, and liquid from the bulk of the drop tends to flow to the edge as evaporation occurs, resulting in deposition of solute particles near the edge. These and other characteristics of ink compositions deposited on various substrates present challenges and opportunities in the area of printable circuit design.

For example, there have been challenges in precisely controlling the printing of electronic materials over substrates and other features (especially high resolution silicon features). Conventional dielectric inks (e.g., sol-gel formulations for spin-on glasses, formulations for spin-on polymer coatings) are formulated to be compatible with spin coating, spray coating, slit coating, extrusion coating, etc. These inks often contain sol-gel materials. Typically, conventional liquid dielectric formulations contain volatile solvents (e.g., methanol or ethanol) and have low viscosity and low surface tension. This can result in dielectric layers that have undesirable cross-sectional profiles (e.g., a coffee-ring profile), thicknesses or thickness variations, film morphology, dimension control, etc. Dielectrics formed by printing conventional dielectric formulations on features (e.g. semiconductor films, metallic lines, etc.) may lead to enhanced electric field effects under certain operating voltages in areas where the dielectric layer is too thin, which can result in premature breakdown and leakage. Additionally, defects may result in films that are printed using conventional dielectrics, such as an undesirable roughness (an "orange peel" appearance). When they are used in an inkjet printing process, the dielectrics may cause clogging of and/or contamination in the inkjet nozzles due to evaporation of the high volatility solvents.

Advances in the art provide for improvements in spreading characteristics of the printed ink in order to effectively cover certain features, such as semiconductor device features (e.g., source/drain terminal regions, gates, metal lines, capacitor and/or diode plates, etc.) on a substrate on which the dielectric is printed. Too little spreading may result in incomplete coverage of the features (e.g., source/drain terminals may be insufficiently covered to adequately dope the underlying semiconductor), and too much spreading may result in inadvertent coverage of regions intended to be exposed (e.g., contact regions to the source, drain, and gate), which may disrupt the subsequent formation of further circuit structures (e.g., contacts to the source and drain), or inadequate coverage of features having relatively high topological variability (e.g., channel/gate crossovers).

However, even with advances in the spreading characteristics of deposition compounds, when printing on non-porous substrates such as steel, silicon (Si) wafers polyethylene terephthalate (PET), polyethylene naphthalate (PEN), etc., one drop, cell, or other printable unit corresponding to a pixel in the initial image may spread to produce the equivalent of three or more pixels in length and width. Furthermore, the ink deposited may or may not have the proper 3-D profile. Conventional image file standards generally do not specify the necessary corrections required to obtain the desired length, width, height, and 3-D profile of materials printed on a non-porous substrate.

Therefore, it is desirable to provide methods and software for making appropriate corrections to image-based circuit layouts produced by conventional circuit design and layout editing software in order to facilitate printing onto non-porous substrates.

SUMMARY

The present invention relates to methods and software for correcting printable circuit layouts. An exemplary method includes steps of identifying shapes in an input circuit layout, applying a plurality of correction rules to the shapes, and producing an output printed circuit layout in accordance with the identified shapes and the correction rules for the printing technology employed. The input circuit layout generally comprises a bitmapped image or other description (e.g., a graphic data system [GDS] circuit description database, a Caltech Intermediate Form [CIF] file, a Gerber file, a TDB circuit description database, a computer aided design format such as drawing interchange format [DXF], etc.) of at least one printable layer of at least one electronic component, device, or die. A printed integrated circuit device may include multiple layers including metal layers, dielectric layers, dopant layers, etc., which may be deposited in sequential and/or simultaneous steps on an appropriate substrate material.

The resulting output printed circuit layout may comprise a bitmapped image file and/or any other data format suitable for storing the output printable circuit layout, such that ink deposited according to pixels in the output image file will spread or otherwise react to form the shapes or features specified in the input circuit layout (e.g., where each pixel in the bitmapped image corresponds to desired deposition location). Both input and output bitmapped image files may include, for example, raw bitmap files (e.g., BMP files) and/or compressed bitmap files. The compressed bitmap files may be compressed, preferably in a lossless format (e.g., in a TIFF file). The output layout may be provided to a printing device (e.g., for inkjet printing, gravure printing, offset lithography, flexographic printing, micro-spotting, pen-coating, stamping, syringe dispensing, pump dispensing, spray-coating, slit coating, extrusion coating, meniscus coating, screen printing, vapor-jet printing, etc.) or may be further processed (e.g., in order to iteratively apply the present methods and/or to perform other processing).

In an exemplary embodiment, identifying shapes in the input circuit layout may include performing shape detection and/or analysis to identify regions of connected pixels and eroding edges of the regions of connected pixels to identify substantially rectangular regions of connected pixels. In another embodiment, the method may include identifying one/or more die types and/or locations in the input circuit layout. Thus, the correction rules may include one or more rules corresponding to a given die type and/or location, and/or the entire mask.

The correction rules described herein may be implemented as processes (e.g., executable instructions, methods, calculations, etc.), data (e.g., parameters, constants, user settings, etc.), or any combination thereof which describes conditions and/or transformations for adapting an input circuit layout to produce an output circuit layout suitable for printing desired circuit features onto a substrate. In some embodiments, one or more of the correction rules may correlate an output pixel density with sizes (e.g., a length, width, total area, etc.) and/or ranges of sizes of identified shapes. Thus, applying these correction rules may comprise producing an output region in the output circuit layout having the correlated pixel density.

In another embodiment, one or more correction rules may correlate an output pixel density gradient (e.g., wherein an output pixel density varies over one or more dimensions of the desired shape) with sizes (e.g., a length, width, total area, etc.) and/or ranges of sizes of identified shapes. Thus, applying these correction rules may comprise producing an output region corresponding to the one of the rectangular regions and having the output pixel density gradient.

The correction rules may correspond to ink characteristics (e.g., spreading characteristics) for a particular ink composition and/or substrate material. In some embodiments, the rules and/or characteristics may correspond to pixel densities (e.g., corresponding to desired ink volumes) for lines and/or other features (e.g., areas and/or shapes that are wider than a predetermined line width), which may also correspond to a particular ink composition and/or substrate material. The rules may also include rules for adding or removing a number of pixels at one or more edges of a given shape.

In another embodiment, the method may include applying stitching corrections to the output printed circuit layout. The stitching corrections may be implemented as correction rules to be applied during one or more correction iterations and/or as a discrete processing step. The stitching correction may, for example, compensate swath edges where an ink deposition device (e.g., an inkjet printing head, gravure print drum, ink spray nozzle, etc.) prints to overlapping regions of the substrate in successive passes. In these overlapping regions, ink deposited in a previous swath may dry, dewet, or experience other changes between each pass of the deposition head, which may result in different shape characteristics.

In an exemplary embodiment, applying stitching corrections includes steps of determining a stitching region in the output printed circuit layout (e.g., where sequential passes of an output device are predicted to overlap) and adjusting a pixel density in the stitching region (e.g., to increase pixel density in regions where ink from a previous path may have dried).

Embodiments of present invention may include software (e.g., computer-readable media comprising computer-readable instructions), circuits, systems, etc. adapted to perform the operations disclosed herein. The software may be adapted to operate a general purpose computer, and may include a user interface configured to allow a user to select input and/or output layouts, select correction operations to perform, to select and/or enter correction or other parameters, to apply "manual" selection of shapes and/or droplet location corrections before and/or after applying correction rules, etc. Alternatively, embodiments of the present invention may be embedded (e.g., as application-specific integrated circuits, microprocessor firmware, etc.) in a printing device and/or component of a printing device (e.g., to preprocess input layouts according to the present invention). Similarly, embodiments of the present invention may include one or more programmable devices configured to perform the operations described herein, and/or computer-readable media including instructions adapted to configure such a programmable device to perform these operations.

Embodiments of the present invention further allow for more precise control of spreading and effective coverage of features (e.g., source/drain terminal regions, gates, capacitors, diodes, interconnects, etc.) on a substrate by a printed ink composition for depositing electronic materials (e.g., semiconductors, metals, dielectrics, dopants, and/or any other material used in the fabrication of an electronic material). This approach to forming electronic devices or structures may also be cost effective due to the efficient usage of the electronic materials and/or precursor materials, combination of deposition and patterning of the electronic materials into one printing step, etc. The present invention may be applicable to the manufacturing of electronic components including thin film transistors, capacitors, diodes etc. and circuits thereof on various substrates including, but not limited to, glass (e.g., quartz, liquid crystal display (LCD) glass) sheets or slips, plastic and/or metal foils, sheets or slabs, silicon wafers, etc., all of which may further include one or more barrier and/or planarization layers (such as a polyimide or other polymer, silicon oxide and/or aluminum oxide, etc.) thereon. Applications of the circuitry include but are not limited to displays, RF devices, sensors, volatile and nonvolatile memory, photovoltaic cells, etc. Further benefits and other advantages of the present invention will become readily apparent from the detailed description of the preferred embodiments.

DETAILED DESCRIPTION

Reference will now be made in detail to certain embodiments of the invention, examples of which are illustrated in the accompanying drawings. While the invention will be described in conjunction with preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following disclosure, numerous specific details are given to provide a thorough understanding of the invention. However, it will be apparent to one skilled in the art that the present invention may be practiced without these specific details. In other instances, well-known methods, procedures, components, and circuits have not been described in detail, to avoid unnecessarily obscuring aspects of the present invention.

In the present disclosure, the term "deposit" (and grammatical variations thereof) is intended to encompass all forms of deposition, including blanket deposition, coating, patterned deposition, and printing, unless the context clearly indicates otherwise. Furthermore, the terms "drop" and "ink drop" are generally interchangeable and are intended to refer to any unit of ink deposited on a surface by any form of deposition. Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

The invention, in its various aspects, will be explained in greater detail below with regard to exemplary embodiments.

An Exemplary Method

Figure 1:
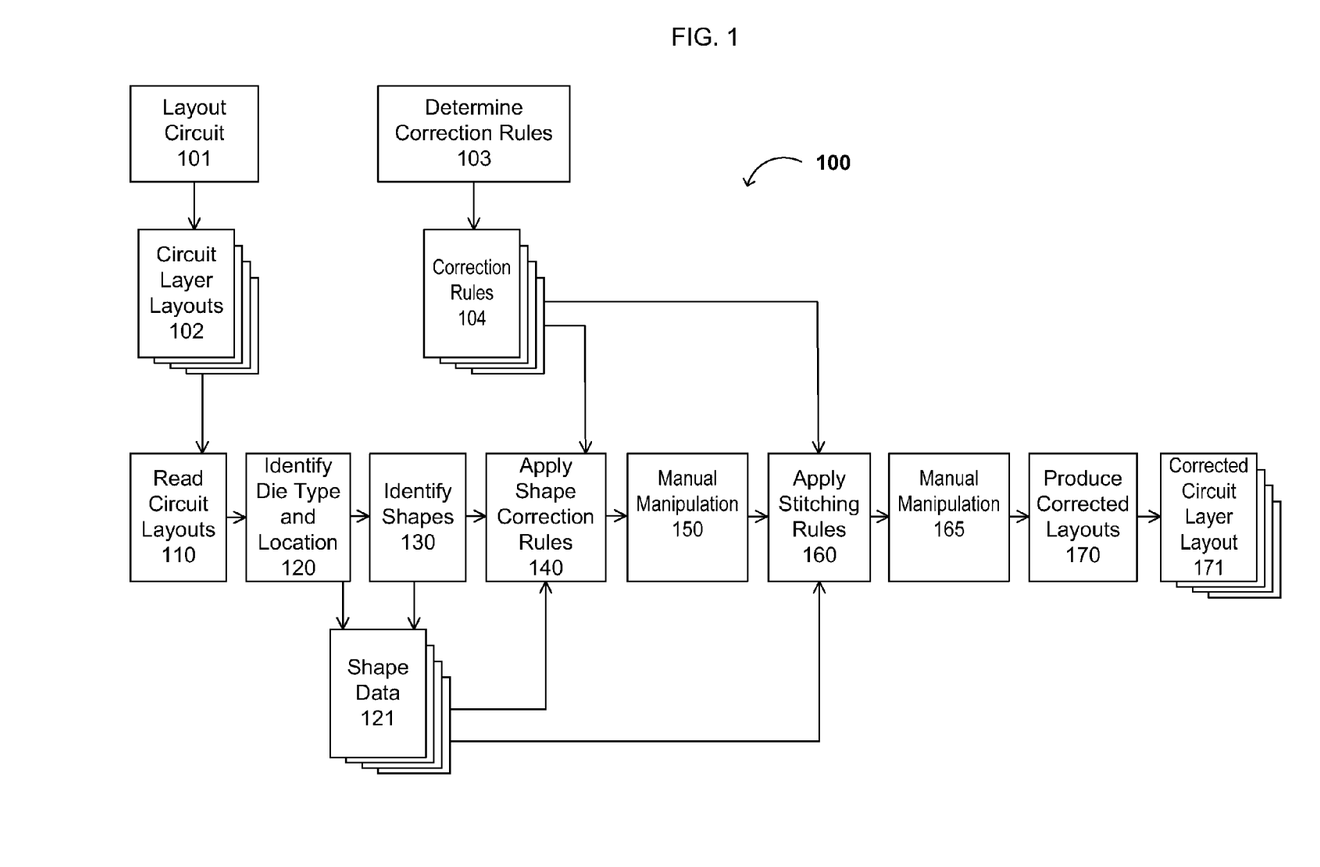
FIG. 1 shows a flowchart of an exemplary method of correcting a printable circuit layout.

FIG. 1 shows an exemplary embodiment of a method 100 for correcting printed circuit layouts. The method generally reads a circuit layout (step 110), identifies die types and/or location (step 120), identifies shapes in the layout (step 130), applies corrections to the layout (steps 140, 150, and 160), and produces a corrected layout (step 170). Step 110 generally receives circuit layer layouts 102, which may be files or other data structures produced at step 101. The circuit may be laid out at 101 by a semiconductor layout editor (e.g., a GDS compatible or other circuit layout editor) and/or a computer aided design application (e.g., AutoCAD, etc.), by an integrated circuit layout process, "by hand" using an image drawing software application, etc. Circuit layer layouts 101 may comprise one or more bitmapped image files, such as TIFF or BMP bitmap image files (e.g., where each pixel in the bitmapped image corresponds to desired deposition location) and/or any other data format suitable for storing the output printable circuit layout (e.g., a GDS, TDB, CIF, Gerber, DXF, or other circuit layout data file). Preferably, the image files are uncompressed or losslessly compressed (e.g., in a compressed TIFF bitmapped image file), as conventional lossy image compression algorithms (e.g., JPEG) may discard information that would be imperceptible to human vision but important for circuit manufacturing.

Step 110 may also include converting, resampling, and/or otherwise pre-processing the input layout file to produce a suitable working bitmap before applying further corrections. Thus, step 110 may include converting a circuit layout file (e.g., a semiconductor layout mask, a GDS or other circuit database file, a CAD file, etc.) into a bitmap (which may be stored as a raw bitmap in memory and/or in a storage device and/or stored in a losslessly compressed format such as TIFF). For example, step 110 may include a conventional GDS-to-TIFF conversion process. Step 110 may also include pre-processing the input layout (or a derivative thereof) to produce a bitmap having a dot pitch or pixel size corresponding to a specific printing process, such that each pixel represents a single droplet or other printable unit of output. The dot pitch or pixel size thus corresponds to the resolution of the printing process. The dot pitch may conventionally range from 1 µm or less up to 100 µm or more depending on the printing technology, although it will be recognized that the present embodiments may be applied to output devices of any resolution.

Figure 2A:
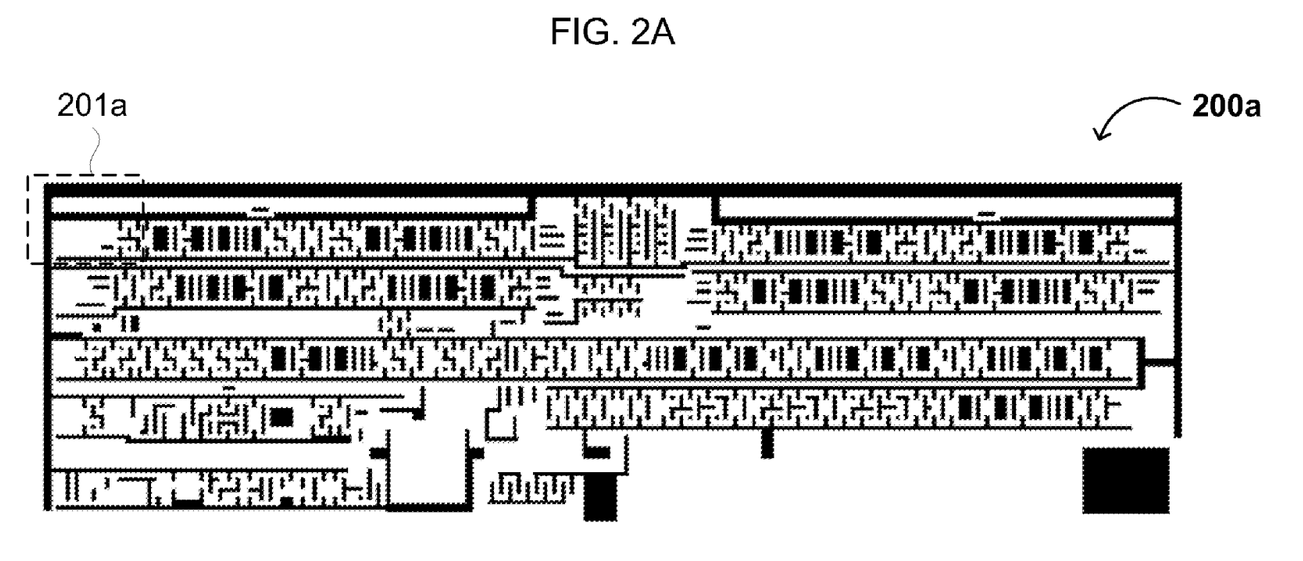
FIGS. 2A-2C are views of an exemplary printable circuit layout and magnified sections thereof, before and after correction according to exemplary embodiments.
Figure 2B:
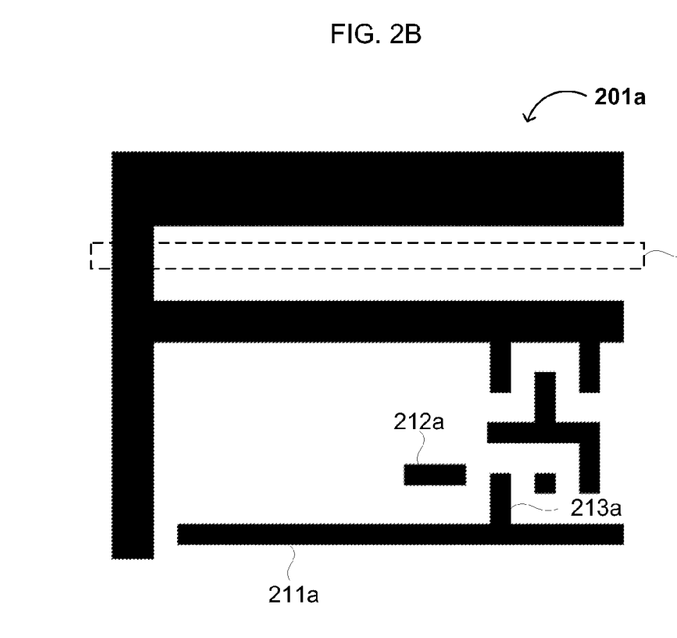
Figure 2C:
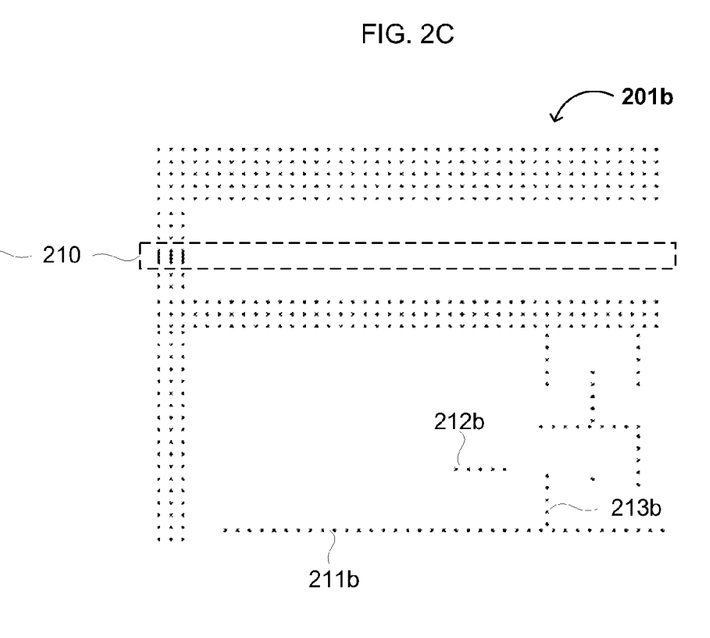

FIG. 2A shows an exemplary input printable circuit layout 200a (e.g., input circuit layout 102 in FIG. 1) for a metal layer of a printable integrated circuit die. FIG. 2B shows a magnified section 201a of input layout 200a, and FIG. 2C shows a corresponding magnified section 201b of an output layout (e.g., output circuit layout 171 of FIG. 1).

Referring again to FIG. 1, before performing the present method for a layer of the circuit layout it may be desirable to determine or establish a set of correction rules 103 to be included in a rules database or other data storage 104 for each layer to be processed. Step 103 of determining the correction rules may include a user interface to enter ink characteristics or other parameters. Alternatively, the rules may be derived from empirical observation of ink characteristics (e.g., for a particular ink composition on a particular substrate) and may include data and/or executable instructions to implement the correction rules. Some of the rules may correlate line drop density, area drop density, number of pixels to remove at the edges for a given shape, number of extra drops required for stitching, etc.

The correction rules described herein may be implemented as processes (e.g., executable instructions, methods, calculations, etc.), data (e.g., parameters, constants, user settings, etc.), or any combination thereof which describes conditions and/or transformations for adapting an input circuit layout to produce an output circuit layout suitable for printing desired circuit features onto a substrate. The correction rules may correspond to ink characteristics (e.g., spreading characteristics) for a particular ink composition and/or substrate material. For example, one or more of the correction rules may correlate an output pixel density with sizes (e.g., a length, width, total area, etc.) and/or ranges of sizes of identified shapes. Thus, applying these correction rules may comprise producing an output region in the output circuit layout having the correlated pixel density.

Based on the image or images received, step 120 identifies the die type (from a plurality of different die types) and the location thereof on a printing substrate. The die types may comprise main circuit die types as well as fiducial die types. Once identified, at step 130 each die is analyzed to identify shapes in the input layout and the features on each die are identified and recorded (e.g., in shape data 121). It will be recognized that many pattern and/or shape recognition techniques may be applied to identify shapes and/or continuous areas at step 130. After the shapes are identified, step 140 applies correction rules 104. Optionally, at step 150 manual manipulations may be performed on these objects as well as unrecognized objects (e.g., using a review editor user interface). The manual manipulations may include, for example, the manual addition or removal of pixels.

The conversion rules for each mask layer may depend largely on the type of printing to be used. Most printing techniques known in the art fall into one of two categories. The first category generally includes printing techniques similar to inkjet printing and gravure printing, wherein both shape correction and drop density corrections may be desirable to create an output layout or mask that results in printed features with correctly 3-D morphological shapes. The second category generally includes printing techniques similar to screen printing and intaglio printing, wherein droplet density correction may not be necessary while shape correction is critical to produce the desired printed 3-D morphological shapes. The present embodiments may be applied to all types of target printing techniques with an appropriate selection of correction rules.

Gravure printing produces results similar to inkjet printing in that small cells deposit precise amounts of ink in a pattern. However, in gravure printing the pattern is defined by an engraved drum. On the gravure drum, the engraved image generally comprises small recessed cells (or 'dots') that act as tiny wells. The depth and size of each cell generally controls the amount of ink that gets transferred to the substrate, typically via pressure, osmosis, and/or electrostatic pull. Thus, the corrections for cells in a gravure-printable layout are similar to corrections for an inkjet-printable image (e.g., trimming, wicking correction, droplet density reduction, variable droplet density, etc.), with some differences.

One such difference between gravure and inkjet printing is that, while cell density and location may be specified the spacing between the sidewalls and the cell size and depth are not necessarily defined exactly by input sent to the printer (e.g., an output layout produced according to the operations presented herein). Thus, these are parameters may be defined independently of the output layout, or a lower pixel pitch base mask could be produced and spaces added (e.g., by input file pre-processing and/or by tailored conversion rules). It will be recognized, however, that these specifications may also depend on the technologies, materials, processes, etc. used to make the drum (e.g., laser engraving, diamond punch, etc.) and may not need to be specified as long as the mask and pixel densities are in a configuration compatible with the technology being used.

In a printing process such as screen printing the volume of ink deposited onto a substrate is typically determined by the mesh characteristics of the screen. As a result removing pixels and/or changing droplet densities (e.g., as may be performed for inkjet-type printing processes) may not be needed to produce a desired areal shape. Intaglio printing mask manipulation is similar to screen printing since in that there is rarely a need to reduce pixel density. However, corrections such as trimming, wicking correction, and any function that physically alters the size of objects to account for ink spread and other rheological problems may be used. Furthermore, masking pixels in the middle of objects (e.g., reducing droplet density) may also be used to more precisely control the thickness of printed features.

Once each die and/or die layer has been manipulated, the changes may be processed for the entire circuit layout, and at optional step 160 corrections for the proper stitching may be applied. Stitching step 160 may also include further manual manipulations (e.g., for an entire wafer, sheet, slab, or other substrate unit). The stitching corrections may be implemented as correction rules to be applied during one or more correction iterations and/or as a discrete processing step. Stitching may occur where the pattern is printed in multiple passes of a printing tool, such that at the intersection of each swath (e.g., a region of the pattern covered by one pass of the printing tool) there may be a stitch line. In these overlapping regions, ink deposited in a previous swath may dry, dewet, or experience other changes between each pass of the printing tool, which may result in different shape characteristics. A stitch line may, for example, require extra drops to ensure that the pattern is continuous along the intersection, depending upon the material being printed.

Thus, step 130 and/or step 160 may include determining a stitching region in the output printed circuit layout (e.g., where sequential passes of an output device are predicted to overlap) and adjusting a pixel density in the stitching region (e.g., to increase pixel density in regions where ink from a previous path may have dried). For example, FIGS. 2B and 2C show stitching region 210, where the stitching region 210 of output section 201*b* has an increased pixel density.

It will be recognized that the steps of the present method may be repeated in an iterative fashion. For example, step 130 may be repeated iteratively to erode a shape into finer constituent shapes. Alternatively, steps 140 and 150 may be performed iteratively to, for example, apply multiple rule-sets to the objects, refine the process based on manual adjustments, implement stitching corrections as a rule-set, etc. After all of the automatic corrections have been performed, an optional final manual manipulation step 165 may be performed.

At step 170, corrected image files 171 for the circuit layout (s) may be output. The output 171 may comprise, for example, corrected bitmapped image (e.g., TIFF, BMP, etc.) files, "native" printer page description files, and/or any other appropriate representation of the corrected layout(s). The output layout may be provided directly to a printing device (e.g., for inkjet printing, micro-spotting, pen-coating, syringe dispensing, pump dispensing, vapor-jet printing, etc.) or may be further processed (e.g., in order to iteratively apply the present methods and/or to perform other processing) and/or used to make a mask, screen, die, stamp, or other component used in the printing process (e.g., for gravure printing, offset lithography, flexographic printing, stamping, screen printing, etc.).

Another Exemplary Method

Figure 3:
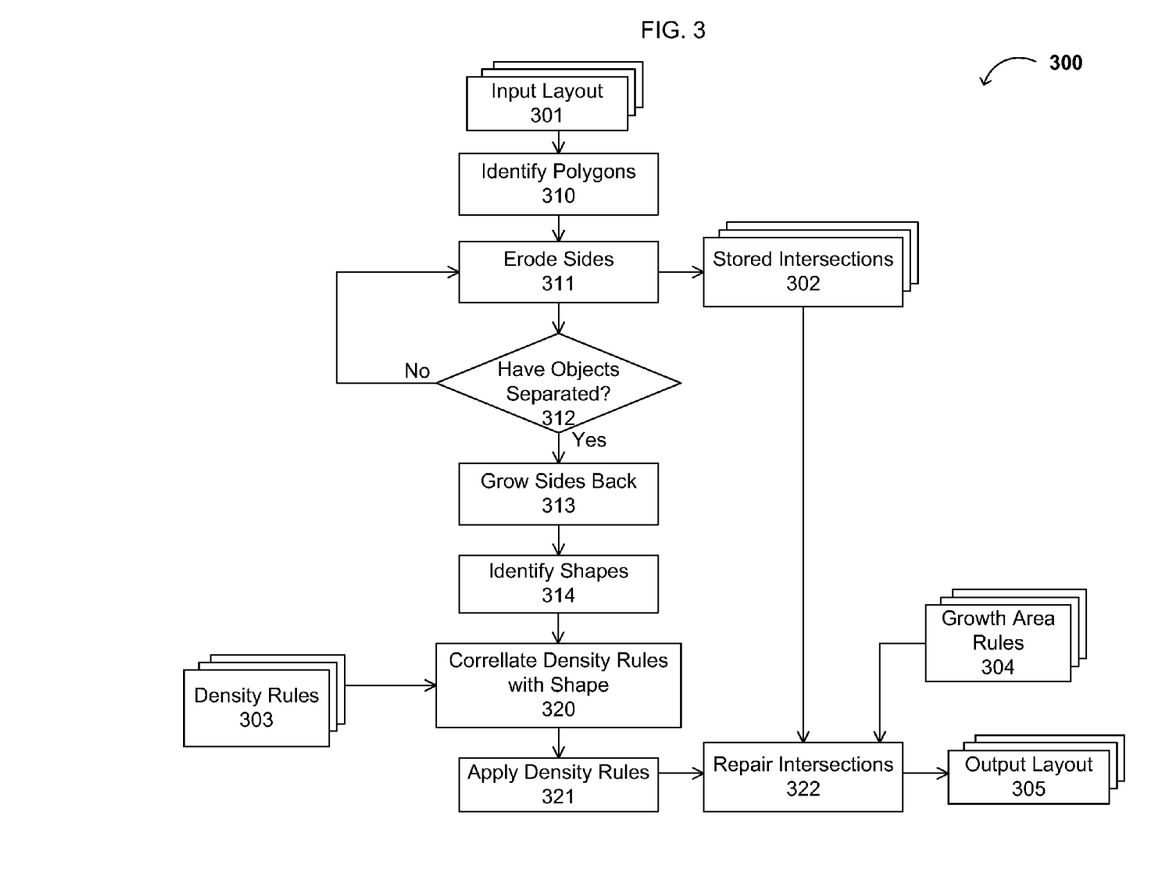
FIG. 3 shows a flowchart of another exemplary embodiment of a method of correcting a printable circuit layout.

FIG. 3 shows an exemplary method 300 for applying corrections to an input layout. The steps of method 300 generally correspond to one or more iterations of steps 130 and 140 of FIG. 1. Step 310 receives input layout 301 and identifies polygons in the layout. Input layout 301 may be produced, for example, by a semiconductor layout editor (such as Cadence or L-Edit) and generally comprises a number of polygon regions. Each polygon may comprise one or more connected lines, squares, rectangles, circles, etc.

Figure 4A:
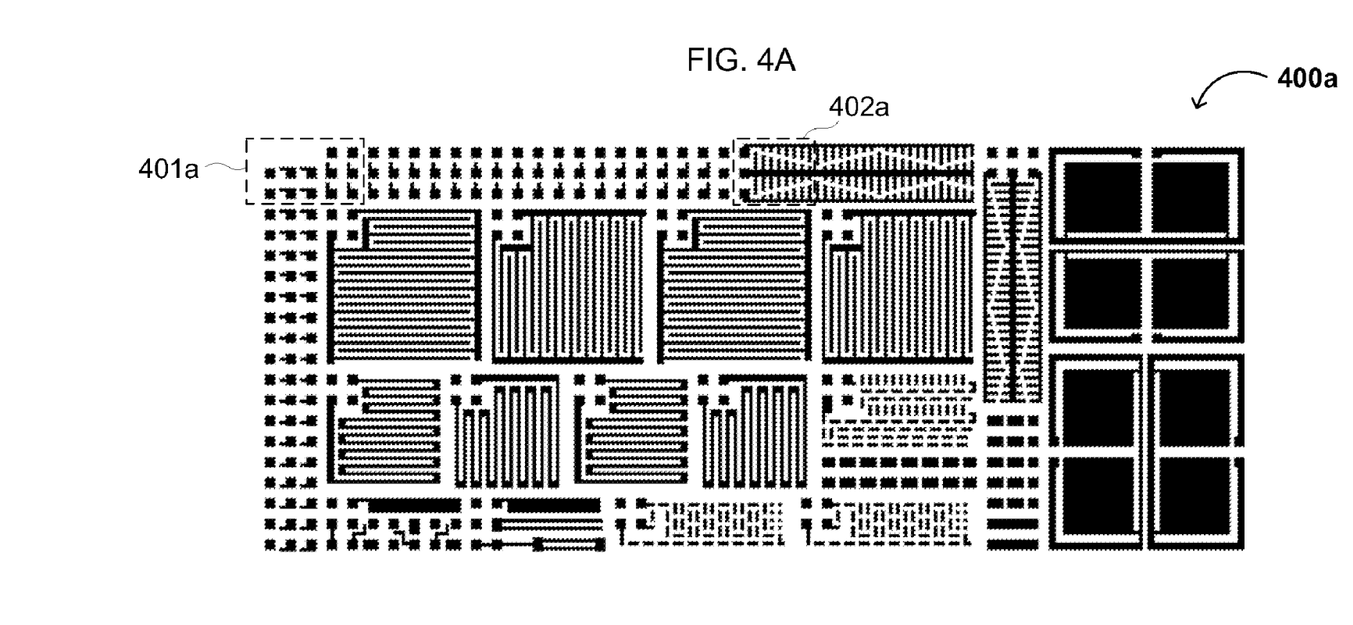
FIGS. 4A-4E are views of another exemplary printable circuit layout and magnified sections thereof, before and after correction according to exemplary embodiments.
Figure 4B:
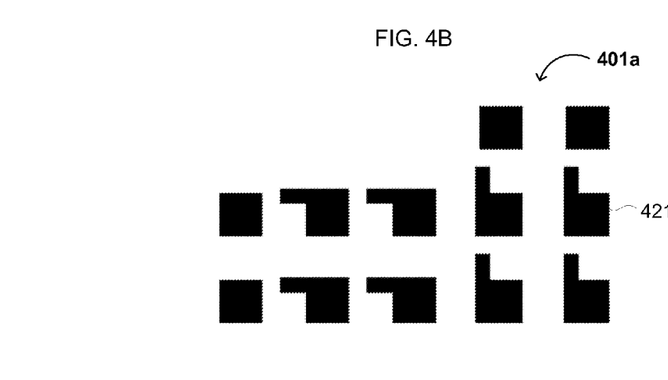
Figure 4C:
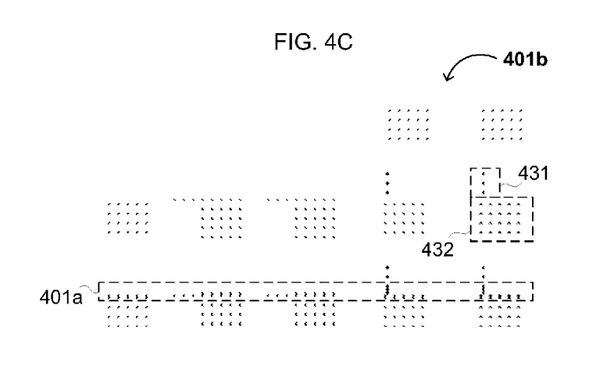
Figure 4D:
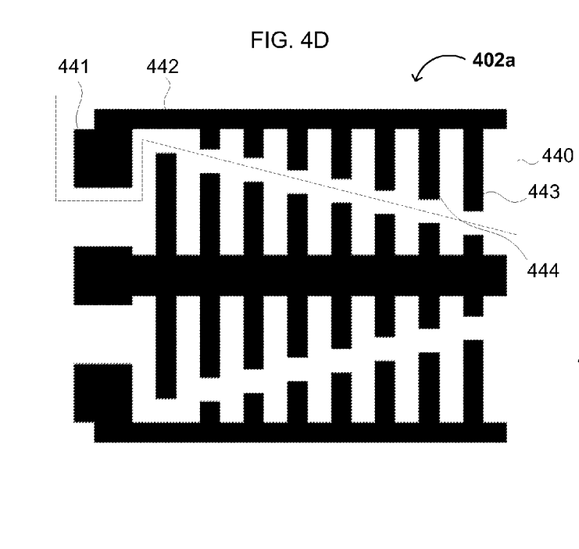
Figure 4E:
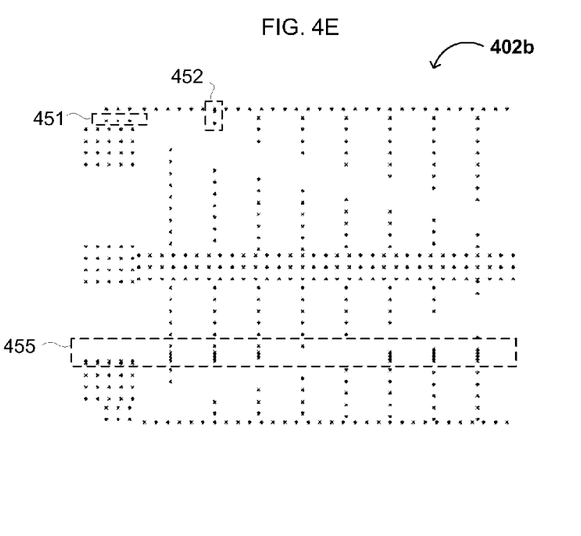

FIG. 4A shows another exemplary input printable circuit layout 400a for a metal layer of a printable integrated circuit die. FIGS. 4B and 4D show magnified sections 401a and 402a, respectively, of input layout 400a. FIGS. 4C and 4E show corresponding magnified sections 401b and 402b, respectively, of an output layout with corrections applied as described herein.

Referring again to FIG. 3, step 310 may include, for example, performing blob detection and/or other known detection and/or analysis to identify regions of connected pixels. At step 311, the edges of the polygons are eroded (e.g., to remove one or more pixels from the edges of the polygon). At step 312, the method determines whether the remaining shapes have been decomposed into constituent rectangles or are still connected and whether the erosion process is complete. The erosion process may be complete, for example, when all of the polygons have been decomposed into substantially rectangular constituent shapes. Thus, the method analyses the polygons and separates them into their constituent shapes by eroding them uniformly on all sides. After the final erosion step, wherein the objects have separated, the sides of the objects may be grown back at step 313, and the remaining object shapes may be identified at step 314. It will be recognized that many pattern and/or shape recognition techniques may be applied to identify shapes and/or continuous areas in step 314. For example, a conventional software library and/or application may be used to identify shapes.

Erosion steps 311 through 312 may continue until individual squares, rectangles, and/or other polygons can be identified. For example, polygon 421 of FIG. 4B may be eroded to locate polygons corresponding to shapes 431 and 432 in FIG. 4C. In another example, polygon 440 of FIG. 4D may be eroded to locate constituent parts including square 441 horizontal line 442, and vertical lines 443 and 444. The amount of erosion required to completely break up each different polygon may vary. In some cases, a complete decomposition is not necessary for every polygon. Therefore step 312 may include a user-defined and/or predetermined erosion parameter to control the level of decomposition. If the erosion is not complete, then the method repeats steps 310 through 312 until a desired completion test is satisfied.

In order to produce printed circuit features with a desired size and 3-D morphology, droplet density may be tuned to specific shape types as well as shape sizes. For example, the correction rules may classify shapes having a maximum width and/or a minimum length as lines which may benefit from a different droplet density than wider features. Similarly, relatively smaller rectangular features may benefit from a different droplet density than a relatively larger rectangle. Thus, after step 314 is complete and the shapes have been identified, the method proceeds to step 320 to correlate density rules 303 with the identified shapes.

Density rules 303 may include desired density and/or trimming rules for one or more size ranges (e.g., for lines having a maximum width and a minimum length, for relatively large and/or small rectangles, etc.). For example, if there are two rectangles that have the same input width of 10 pixels wide and different input lengths of 50 and 100 pixels, respectively, then the rules may determine that both rectangles correspond to lines. Each line may then be reproduced in the output layout with a specified output line width. Referring again to FIGS. 2B and 2C, for example, lines 211a, 212a, and 213a in input layout section 201a may be reproduced as one-pixel wide lines 211b, 212b, and 213b, respectively, in output layout section 201b. In another exemplary rule, a rule for input rectangles that are 10 pixels wide and 40 to 200 pixels may provide for trimming the width of corresponding rectangles in the output layout to one pixel and call for an exemplary output linear pixel density of 1 "drop" pixel for every 7 linear pixels. The density rules may also include a default density for shapes that are not specifically identified. The rules may be entered by a user, stored from a previous user session, retrieved from a rules library, etc. Such rules may be established empirically by first determining the required 3-D shape and then performing a series of experiments that establish how drop deposition density relates to thickness and shape size.

It is important that the original polygons remain connected in the final output pattern. Thus, step 311 may include recording intersection information 302 during the erosion process. For example, the correction rules may include trimming rules to narrow and/or shorten certain features (e.g., to reduce lines to one pixel in length). Thus, after the density and/or other rules are applied at step 321, step 322 may be performed to restore any disconnected intersections in "growth areas." For example, growth areas 451 and 452 in FIG. 4E may be filled in order to compensate for a trimming of line 441 from original layout section 402a in FIG. 4D. The rules applied to the growth areas (e.g., to determine a density in the growth areas) may be the same as rules used for one or more of the intersecting shapes, or may be provided by growth area rules 304 (e.g., corresponding to a specific intersection type or other characteristics of the intersection and/or the intersecting shapes).

Even more advanced control of drop density patterns may be realized according to the present embodiments. For example, a particular thickness (e.g., depth of the line above the substrate) may be desired for a line. It may further be desirable to control the thickness of a line down the centerline without significantly increasing the line width. The thickness may be accomplished by depositing more ink volume at the center than at the edges. For example, this can be accomplished by using a dense droplet pattern in the center and then using a sparser pattern at the edges. Alternatively, the ink volume may be increased by increasing the ink deposition volume in the center (e.g., by specifying large droplets for inkjet printing, deeper cell depth for gravure printing, etc.) Such volumes may, for example, be encoded in an output layout having multiple bits for each pixel. Thus, density rules 303 may include rules for controlling a pixel density gradient and/or a deposition volume gradient with respect to one or more axes of a shape.

Thus, the present method may tune drop densities near object edges, centerlines, or any arbitrary part of an identified shape. For example, a growth area rule 304 may include a density gradient to define a transition region. Within this transition region method may apply a new drop density (e.g., a sparser or a graduated density). This process may be performed after all other trimming operations.

The correction rules and operations described herein may be performed completely automatically and/or may involve one or more user interface operations. For example, some shape identification and corrections may be performed based entirely on predefined rules, data, parameters, etc., while user input may be allowed in order to, for example, identify complex shapes and/or important features, adjust operating parameters, select minimum and/or maximum densities and/or feature size ranges, select gradients and/or transition regions, etc.

Exemplary Software

Embodiments of present invention may include software (e.g., computer-readable media comprising computer-readable instructions), circuits, systems, etc. adapted to perform the operations disclosed herein. The software may be adapted to operate a general purpose computer, and may include a user interface configured to allow a user to select input and/or output layouts, select correction operations to perform, to select and/or enter correction or other parameters, to apply "manual" selection of shapes and/or droplet location corrections before and/or after applying correction rules, etc.

The correction rules described herein may be implemented as processes (e.g., executable instructions, methods, calculations, etc.), data (e.g., parameters, constants, user settings, etc.), or any combination thereof which describes conditions and/or transformations for adapting an input circuit layout to produce an output circuit layout suitable for printing desired circuit features onto a substrate. Thus, the present software may also include instructions and/or data adapted to implement the correction rules.

Alternatively, the correction rules comprise separate modules (e.g., separately-loadable executable instructions and/or data) for implementing correction rules as described herein. Thus, the present software may include instructions adapted to load further instructions and/or data into memory, where the further instructions and/or data are adapted to implement the correction rules.

Exemplary Systems

Embodiments of the present invention may be embedded (e.g., as application-specific integrated circuits, microprocessor firmware, etc.) in a printing device and/or component of a printing device (e.g., to preprocess input layouts according to the present invention). Similarly, embodiments of the present invention may include one or more programmable devices configured to perform the operations described herein, and/or computer-readable media including instructions adapted to configure such a programmable device to perform these operations.

CONCLUSION/SUMMARY

Embodiments of the present invention relate to methods and software for correcting printable circuit layouts, generally including steps of identifying shapes in an input circuit layout, applying a plurality of correction rules to the shapes, and producing an output printed circuit layout in accordance with the identified shapes and the correction rules. The input circuit layout generally comprises a bitmapped image or other description of at least one printable layer of at least one electronic component, device, or die. Embodiments of the present invention further allow for more precise control of spreading and effective coverage of features (e.g., source/drain terminal regions, gates, capacitors, diodes, interconnects, etc.) on a substrate by a printed ink composition including electronic materials.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for correcting printable circuit layouts, said method comprising:
    identifying shapes in an input circuit layout for at least one layer on a substrate, wherein said layer comprises a material in at least one electronic component, device, or die, and said material is to be formed on said substrate by printing an ink composition;
    applying a plurality of correction rules to said shapes, wherein said plurality of correction rules are derived from characteristics of said ink composition; and
    producing, using a computer, an output printed circuit layout in accordance with said identified shapes and said correction rules.

2. The method of claim 1, wherein said input circuit layout comprises at least one bitmapped image file.

3. The method of claim 2, wherein said bitmapped image file comprises a losslessly compressed tagged image file format (TIFF) file.

4. The method of claim 1, wherein said input circuit layout comprises at least one circuit layout description file.

5. The method of claim 4, wherein said circuit layout description file comprises a graphic data system (GDS) circuit description database, a drawing interchange format (DXF) file, a Caltech Intermediate Form (CIF) file, a Gerber file, or a TDB database.

6. The method of claim 1, further comprising encoding said output printed circuit layout to produce at least one bitmapped image file.

7. The method of claim 6, wherein said bitmapped image file has a dot pitch or pixel size corresponding to the resolution of a specific printing process, such that each pixel represents a single droplet.

8. The method of claim 1, wherein identifying shapes in said input circuit layout comprises:
    performing blob analysis to identify regions of connected pixels; and
    eroding edges of said regions of connected pixels to identify rectangular regions of connected pixels.

9. The method of claim 1, wherein:
    said correction rules comprise at least one rule correlating an output pixel density with one or more linear dimensions of one of said identified shapes; and
    applying said correction rules comprises producing an output region in said output circuit layout, wherein said output region corresponds to said one of said identified shapes and said output region has said output pixel density.

10. The method of claim 1, wherein:
    said correction rules comprise at least one rule correlating an output pixel density gradient with one or more linear dimensions of one of said identified shapes and a desired thickness for said one of said identified shapes; and applying said correction rules comprises producing an output region in said output circuit layout, wherein said output region corresponds to said one of said identified shapes and having said output pixel density gradient.

11. The method of claim 1, wherein said correction rules correspond to ink drop characteristics for said material.

12. The method of claim 11, wherein said ink drop characteristics comprise a line drop density and/or an area drop density.

13. The method of claim 11, wherein said ink drop characteristics comprise spreading characteristics.

14. The method of claim 1, wherein said correction rules comprise at least one rule to remove a number of pixels at one or more edges of a given shape.

15. The method of claim 1, further comprising applying stitching corrections to said output printed circuit layout.

16. The method of claim 15, wherein applying said stitching corrections comprises:
determining a stitching region in said output printed circuit layout, wherein said stitching region corresponds to a location where sequential passes of an output device are predicted to overlap; and
adjusting a pixel density in said stitching region.

17. The method of claim 16, wherein adjusting said pixel density in said stitching region comprises increasing said pixel density in said stitching region.

18. The method of claim 1, further comprising applying manual corrections to said shapes after applying said correction rules.

19. The method of claim 1, further comprising identifying one or more die types and/or locations in said input circuit layout, wherein said correction rules comprise at least one correction rule corresponding to a given die type and/or location.

20. The method of claim 1, wherein said substrate is non-porous, and said layer is to be printed on said non-porous substrate from an ink.

21. The method of claim 1, wherein said correction rules comprise one or more shape correction rules and one or more wicking correction rules.

22. The method of claim 21, wherein printing comprises screen printing or intaglio printing.

23. The method of claim 1, wherein said correction rules comprise one or more drop density correction rules.

24. The method of claim 23, wherein said drop density correction rule(s) comprise reducing a droplet density or varying a droplet density.

25. The method of claim 24, wherein said drop density correction rule(s) comprise reducing said droplet density, and reducing said droplet density comprises masking pixels.

26. The method of claim 23, wherein printing comprises inkjet printing or gravure printing.

27. A non-transitory computer-readable medium comprising computer-executable instructions adapted to:
identify shapes in an input circuit layout for at least one layer on a substrate, wherein said layer comprises a material in at least one electronic component, device, or die, and said material is to be formed on said substrate by printing an ink composition;
apply a plurality of correction rules to said shapes, wherein said plurality of correction rules are derived from characteristics of said ink composition; and
produce an output printed circuit layout in accordance with said identified shapes and said correction rules.

28. The medium of claim 27, wherein said input circuit layout comprises at least one bitmapped image.

29. The medium of claim 27, wherein said computer-executable instructions are further adapted to obtain said input circuit layout from at least one GDS circuit layout description file.

30. The medium of claim 27, wherein said computer-executable instructions are further adapted to encode said output printed circuit layout to produce at least one bitmapped image file.

31. The medium of claim 27, wherein said computer-executable instructions adapted to identify shapes in said input circuit layout comprise instructions adapted to:
perform blob analysis to identify regions of connected pixels; and
erode edges of said regions of connected pixels to identify rectangular regions of connected pixels.

32. The medium of claim 27, wherein:
said correction rules comprise at least one rule correlating an output pixel density with one or more linear dimensions of one of said identified shapes; and
said computer-executable instructions adapted to apply said correction rules comprise one or more instructions adapted to produce an output region in said output circuit layout, wherein said output region corresponds to said one of said identified shapes and said output region has said output pixel density.

33. The medium of claim 27, wherein:
said correction rules comprise at least one rule correlating an output pixel density gradient with one or more linear dimensions of one of said identified shapes and a desired thickness for said one of said identified shapes; and
said computer-executable instructions adapted to apply said correction rules comprise one or more instructions adapted to produce an output region in said output circuit layout, wherein said output regions corresponds to said one of said identified shapes and having said output pixel density gradient.

34. The medium of claim 27, wherein said correction rules correspond to ink drop characteristics for said substrate.

35. The medium of claim 34, wherein said ink drop characteristics comprise a line drop density and/or an area drop density.

36. The medium of claim 34, wherein said ink drop characteristics comprise spreading characteristics.

37. The medium of claim 27, wherein said correction rules comprise at least one rule to remove a number of pixels at one or more edges of a given shape.

38. The medium of claim 27, wherein said computer-executable instructions are further adapted to perform a step of applying stitching corrections to said corrected printed circuit layout.

39. The medium of claim 38, wherein applying said stitching corrections comprises:
determining a stitching region in said output printed circuit layout, wherein said stitching region corresponds to a location where sequential passes of an output device are predicted to overlap; and
altering a pixel density in said stitching region.

40. The medium of claim 39, wherein altering said pixel density in said stitching region comprises increasing said pixel density in said stitching region.

41. The medium of claim 27, wherein said computer-executable instructions are further adapted to provide a user interface for applying manual corrections to said shapes after applying said correction rules.

42. The medium of claim 27, wherein said computer-executable instructions are further adapted to identify one or more die types and/or locations in said input circuit layout, wherein said correction rules comprise at least one correction rule corresponding to a given die type and/or location.

43. The medium of claim 27, further comprising computer-executable instructions and/or data adapted to implement said correction rules.

44. The medium of claim 27, further comprising computer-executable instructions adapted to load further computer-executable instructions and/or data into memory, wherein said further computer-executable instructions and/or data are adapted to implement said correction rules.

45. The medium of claim 27, wherein said correction rules comprise one or more shape correction rules and one or more wicking correction rules.

46. The medium of claim 45, wherein said printing comprises screen printing or intaglio printing.

47. The medium of claim 27, wherein said correction rules comprise one or more drop density correction rules.

48. The medium of claim 47, wherein said drop density correction rule(s) comprise reducing a droplet density or varying a droplet density.

49. The medium of claim 48, wherein said drop density correction rule(s) comprise reducing said droplet density, and reducing said droplet density comprises masking pixels.

50. The medium of claim 47, wherein said printing comprises inkjet printing or gravure printing.

51. A computer system comprising the medium of claim 27, a microprocessor or an application-specific integrated circuit configured to execute said instructions, and a printing device.

* * * * *